US009673763B2

(12) United States Patent
Watanabe et al.

(10) Patent No.: US 9,673,763 B2
(45) Date of Patent: Jun. 6, 2017

(54) POWER AMPLIFIER

(71) Applicant: Murata Manufacturing Co., Ltd., Kyoto (JP)

(72) Inventors: Kazuo Watanabe, Kyoto (JP); Satoshi Tanaka, Kyoto (JP); Norio Hayashi, Kyoto (JP); Kazuma Sugiura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/926,441

(22) Filed: Oct. 29, 2015

(65) Prior Publication Data

US 2016/0134242 A1    May 12, 2016

Related U.S. Application Data

(60) Provisional application No. 62/078,625, filed on Nov. 12, 2014.

(51) Int. Cl.
| | | |
|---|---|---|
| *H03F 1/14* | (2006.01) | |
| *H03F 3/19* | (2006.01) | |
| *H03F 1/02* | (2006.01) | |
| *H03F 3/21* | (2006.01) | |
| *H03F 3/24* | (2006.01) | |

(52) U.S. Cl.
CPC ............ *H03F 3/19* (2013.01); *H03F 1/0222* (2013.01); *H03F 3/211* (2013.01); *H03F 3/245* (2013.01); *H03F 2200/451* (2013.01); *H03F 2200/516* (2013.01); *H03F 2200/555* (2013.01)

(58) Field of Classification Search
CPC ........................................................ H03F 1/14

USPC .......................................... 330/292, 285, 296
See application file for complete search history.

(56) References Cited

U.S. PATENT DOCUMENTS

| | | | | |
|---|---|---|---|---|
| 3,603,892 A | * | 9/1971 | Paine ........................ | H03F 3/42 |
| | | | | 330/296 |
| 7,071,782 B2 | * | 7/2006 | Delpy ....................... | H03F 3/72 |
| | | | | 330/134 |
| 7,560,993 B2 | * | 7/2009 | Hsu ......................... | H03F 1/301 |
| | | | | 330/129 |

FOREIGN PATENT DOCUMENTS

JP        2011-130066 A      6/2011

OTHER PUBLICATIONS

Youn Sub Noh et al., "PCS/W-CDMA Dual-Band MMIC Power Amplifier With a Newly Proposed Linearizing Bias Circuit" IEEE Journal of Solid-State Circuits, vol. 37, No. 9, Sep. 2002.

* cited by examiner

*Primary Examiner* — Henry Choe
(74) *Attorney, Agent, or Firm* — Pearne & Gordon, LLP

(57) ABSTRACT

The present disclosure is to improve the power added efficiency of a power amplifier at high output power. The power amplifier includes: a first capacitor with a radio frequency signal input to one end thereof; a first transistor whose base is connected to the other end of the first capacitor to amplify the radio frequency signal; a bias circuit for supplying bias to the base of the first transistor; and a second capacitor with one end connected to the base of the first transistor and the other end connected to the emitter of the first transistor.

15 Claims, 16 Drawing Sheets

POWER AMPLIFIER

CROSS-REFERENCE TO RELATED APPLICATIONS

This application claims priority to U.S. Provisional Application Ser. No. 62/078,625, filed on Nov. 12, 2014, entitled "POWER AMPLIFIER", the entirety of which is incorporated herein by reference.

BACKGROUND OF THE INVENTION

Field of the Invention
The present invention relates to a power amplifier.
Background Art
A mobile communication device such as a cellular phone employs a power amplifier to amplify power of a radio frequency (RF) signal to be transmitted to a base station.

For example, Patent Document 1 discloses a power amplifier including multiple unit cells. Each unit cell includes an amplification transistor and a bias circuit for supplying bias to the base of the transistor.

CITATION LIST

Patent Document

[Patent Document 1] JP2011-130066 A

SUMMARY OF THE INVENTION

As disclosed in Patent Document 1, such a structure to supply bias to the base of an amplification transistor is common. However, as the output level increases, current flowing from the bias circuit into the base of the amplification transistor increases, resulting in a decrease in power added efficiency (PAE).

The present disclosure has been made in view of such circumstances, and it is an object thereof to improve the power added efficiency of a power amplifier at high output power.

A power amplifier according to one aspect of the present disclosure includes: a first capacitor with a radio frequency signal input to a first end of the first capacitor; a first transistor whose base is connected to a second end of the first capacitor to amplify the radio frequency signal; a bias circuit for supplying bias to the base of the first transistor; and a second capacitor with a first end connected to the base of the first transistor and a second end connected to the emitter of the first transistor.

According to the present disclosure, the power added efficiency of a power amplifier at high output power can be improved.

DETAILED DESCRIPTION

Figure 1:
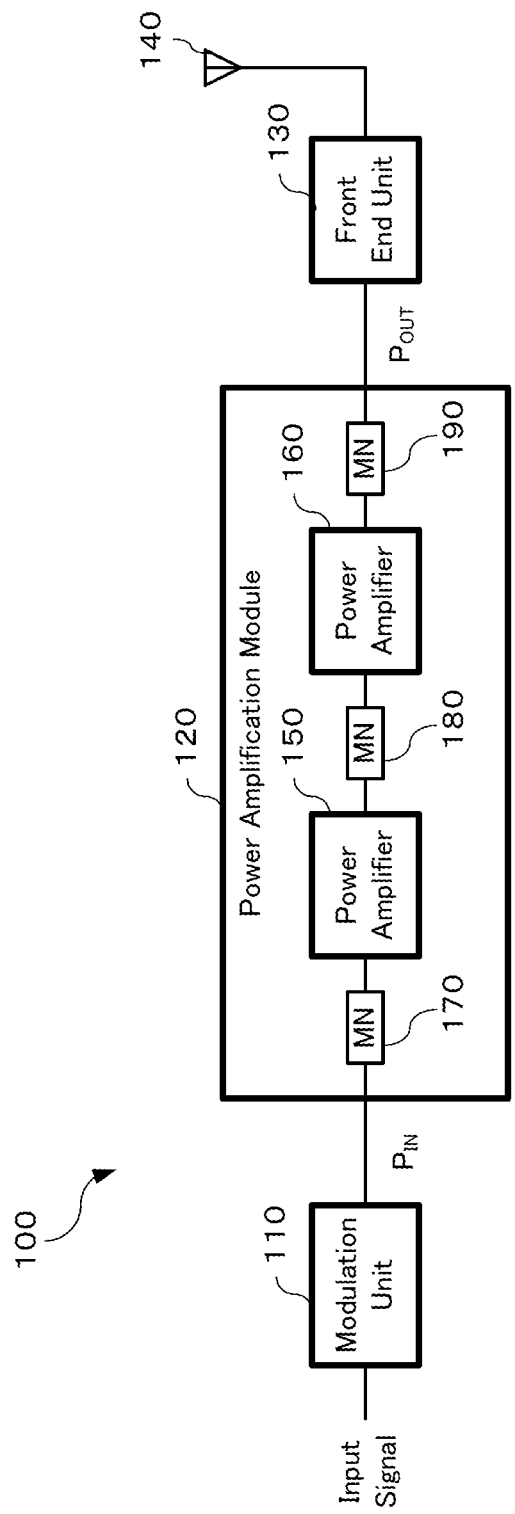
FIG. 1 is a diagram illustrating a configuration example of a transmitting unit including a power amplification module as one embodiment of the present disclosure.

Embodiments of the present disclosure will be described below with reference to the accompanying drawings. FIG. 1 is a diagram illustrating a configuration example of a transmitting unit including a power amplification module as one embodiment of the present disclosure. A transmitting unit 100 is used, for example, in a mobile communication device such as a cellular phone to transmit various signals such as voice and data to a base station. Although the mobile communication device also includes a receiving unit for receiving signals from the base station, the description thereof will be omitted here.

As illustrated in FIG. 1, the transmitting unit 100 includes a modulation unit 110, a power amplification module 120, a front end unit 130, and an antenna 140.

The modulation unit 110 modulates an input signal based on a Global System for Mobile Communications (GSM)® modulation system or the like to generate an RF signal in order to perform radio transmission. For example, the RF signal ranges from about hundreds of MHz to several GHz.

The power amplification module 120 amplifies the power of the RF signal ($P_{IN}$) to a level necessary for transmission to a base station, and outputs the amplified signal ($P_{OUT}$). For example, the power amplification module 120 can be made up of two-stage power amplifiers. Specifically, as illustrated in FIG. 1, the power amplification module 120 can include power amplifiers 150, 160 and matching circuits (MN: Matching Networks) 170, 180, and 190. The power amplifier 150 is a first-stage (drive-stage) amplifier to amplify an input RF signal and output the amplified signal. The power amplifier 160 is a second-stage (power-stage)

amplifier to amplify the input RF signal and output the amplified signal. The matching circuits 170, 180, and 190 are circuits for matching impedance between circuits, and each matching circuit is made up using a capacitor and an inductor. Note that the number of stages of power amplifiers that constitute the power amplification module 120 is not limited to the two stages, and it may be one stage, or three or more stages.

The front end unit 130 performs filtering on the amplified signal, switching to a received signal received from the base station, and the like. The amplified signal output from the front end unit 130 is transmitted to the base station through the antenna 140.

Figure 2:
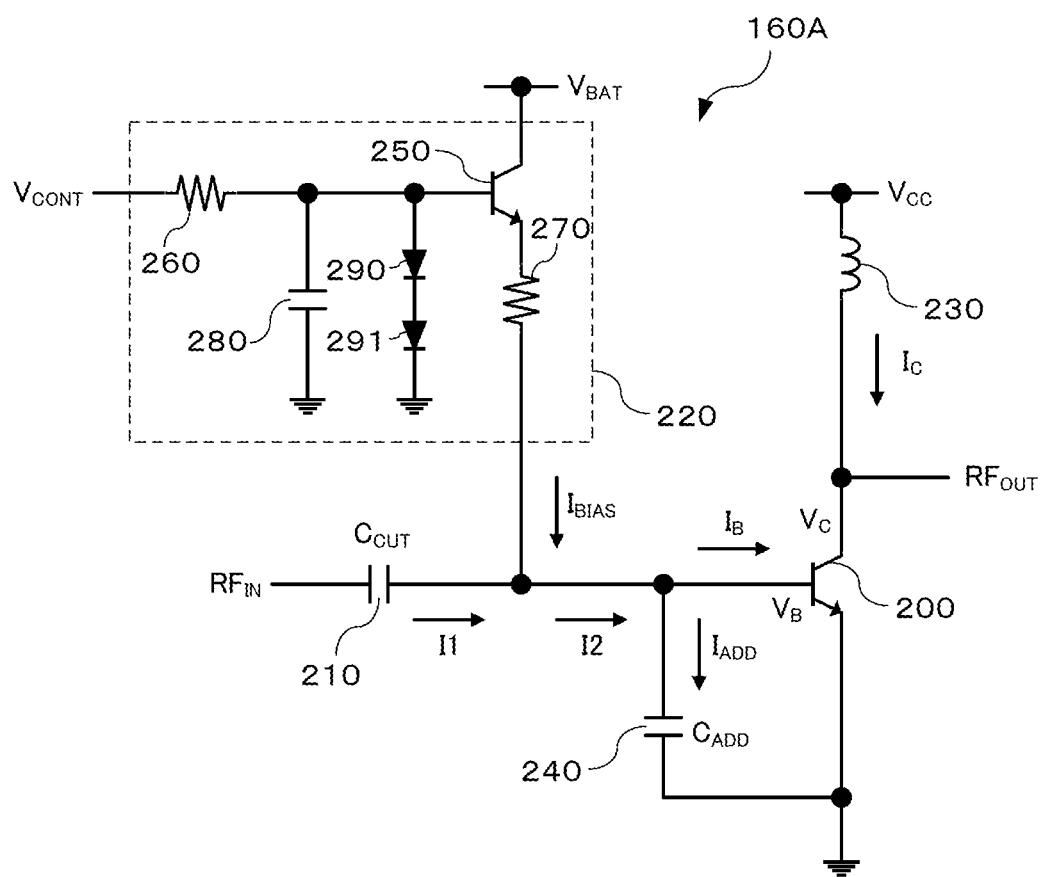
FIG. 2 is a diagram illustrating the configuration of a power amplifier 160A as an example of the configuration of a power amplifier 160.

FIG. 2 is a diagram illustrating the configuration of a power amplifier 160A as an example of the configuration of the power amplifier 160. The power amplifier 160A includes an NPN transistor (hereinafter simply called "transistor") 200, a capacitor 210, a bias circuit 220, an inductor 230, and a capacitor 240.

The transistor 200 (first transistor) is, for example, a heterojunction bipolar transistor (HBT). Power-supply voltage $V_{CC}$ is supplied to the collector of the transistor 200 through the inductor 230, an RF signal ($RF_{IN}$) is input to the base of the transistor 200 through the capacitor 210, and the emitter of the transistor 200 is grounded. Further, bias is supplied from the bias circuit 220 to the base of the transistor 200. The transistor 200 amplifies the RF signal input to the base and outputs the amplified signal ($RF_{OUT}$) from the collector.

The RF signal is input to one end of the capacitor 210 (first capacitor), and the other end of the capacitor 210 is connected to the base of the transistor 200. The capacitor 210 cuts a DC component of the RF signal and outputs the RF signal to the base of the transistor 200.

The bias circuit 220 includes a transistor 250, resistors 260, 270, a capacitor 280, and diodes 290, 291. Battery voltage $V_{BAT}$ is supplied to the collector of the transistor 250 (second transistor), bias control voltage $V_{CONT}$ is supplied to the base of the transistor 250 through the resistor 260, and the emitter of the transistor 250 is connected to one end of the resistor 270. The bias control voltage $V_{CONT}$ is applied to one end of the resistor 260, and the other end of the resistor 260 is connected to the base of the transistor 250. One end of the resistor 270 (first resistor) is connected to the emitter of the transistor 250, and the other end of the resistor 270 is connected to the base of the transistor 200. One end of the capacitor 280 is connected to the base of the transistor 250, and the other end of the capacitor 280 is grounded. The diodes 290, 291 are connected in series, where the anode of the diode 290 is connected to the base of the transistor 250, and the cathode of the diode 291 is grounded. The bias circuit 220 outputs bias current $I_{BIAS}$ to the base of the transistor 200 based on the bias control voltage $V_{CONT}$. The capacitor 280 can reduce noise input to the base of the transistor 250. The diodes 290, 291 can reduce fluctuations in base voltage of the transistor 250 with respect to variations in bias control voltage $V_{CONT}$.

The power-supply voltage $V_{CC}$ is applied to one end of the inductor 230, and the other end of the inductor 230 is connected to the collector of the transistor 200. The power-supply voltage $V_{CC}$ is, for example, a predetermined level of voltage generated by a regulator.

The capacitor 240 (second capacitor) is, for example, MIM (Metal Insulator Metal) capacitance. One end of the capacitor 240 is connected to the base of the transistor 200, and the other end of the capacitor 240 is connected to the emitter of the transistor 200. For example, the capacitance value $C_{ADD}$ of the capacitor 240 is roughly equivalent or substantially similar to the capacitance value of the transistor 200 in an off state. The capacitor 240 is provided to improve the power added efficiency of the power amplifier 160A at high output power.

Figure 3:
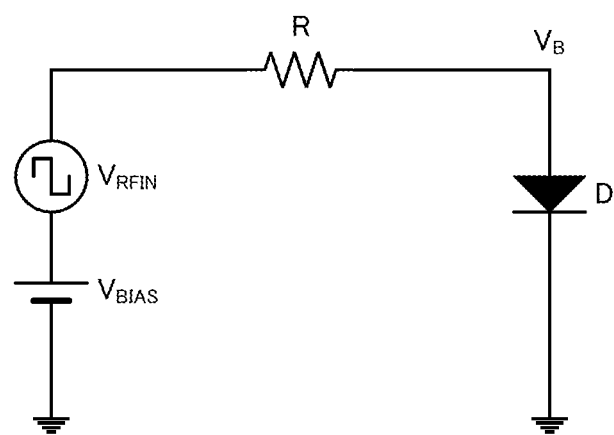
FIG. 3 is a diagram illustrating a simplified equivalent circuit of the power amplifier 160A, where the base-emitter junction of a transistor 200 is set as a simple diode D and an input signal is represented as a square wave signal.

First, operation when the capacitor 240 is not provided in the power amplifier 160A will be described. As illustrated in FIG. 3, the configuration of the power amplifier 160A is simplified for illustrative purposes. In FIG. 3, the base-emitter junction of the transistor 200 is represented as a simple diode D to focus attention on the base current. Further, for the sake of simplification, such a structure that the bias voltage $V_{BIAS}$ is applied through the resistor 270 and the RF signal is applied through the capacitor 210 is represented as a structure where both signals are applied through a resistor R. In addition, it is assumed that the input signal is a square wave signal. The resistance value of the resistor R has a high degree of freedom, which is, for example, about 16Ω.

The characteristics of the diode are simplified as follows: An equivalent circuit for the diode can be described as a parallel connection of non-linear resistance and non-linear capacitance.

Figure 4:
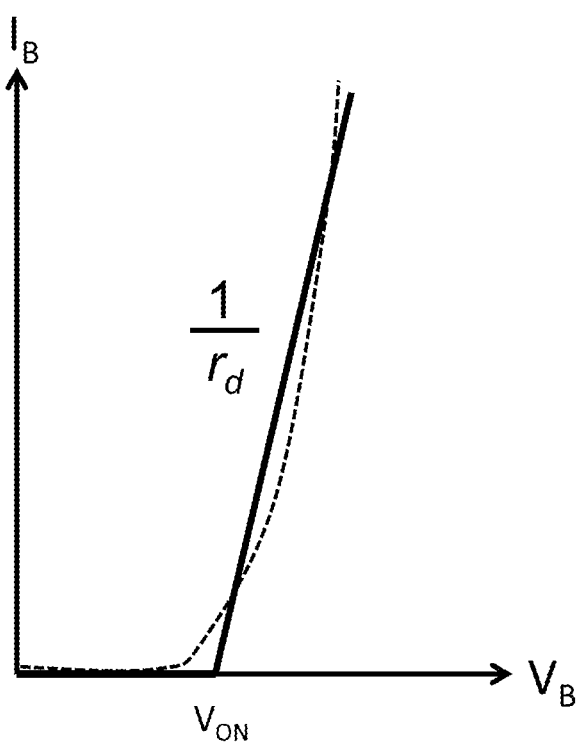
FIG. 4 is a graph illustrating the voltage $V_B$-current $I_B$ characteristic of the diode.

Although the voltage $V_B$-current $I_B$ characteristic of the non-linear resistance is principally expressed as an exponential function as indicated by the broken line in FIG. 4, the non-linear resistance is represented here by a piecewise linear model in which the non-linear resistance is completely turned off when the voltage $V_B$ is less than on-voltage $V_{ON}$ and takes a resistance value $r_d$ when the voltage $V_B$ is higher than or equal to the on-voltage $V_{ON}$ as indicated by the solid line in FIG. 4. When the power amplifier 160A operates with the maximum power, collector current flowing through the transistor 200 is about 300 to 400 mA. Since the current amplification factor of the transistor 200 is about 100, base current is about 3 to 4 mA. The resistance value $r_d$ in this case is about 6Ω.

Figure 5:
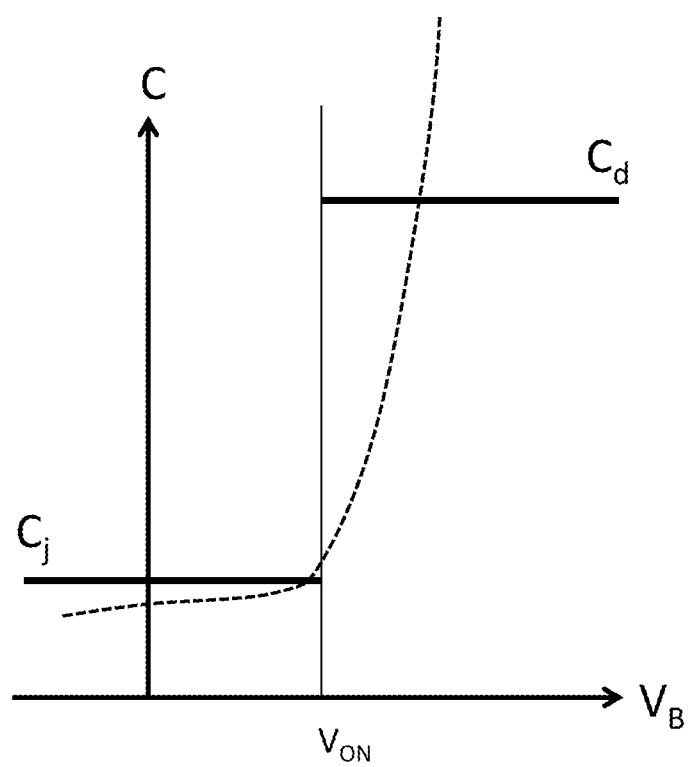
FIG. 5 is a graph illustrating the voltage $V_B$-capacitance C characteristic of the diode.

As indicated by the broken line in FIG. 5, when the voltage $V_B$ is less than the on-voltage $V_{ON}$, the capacitance value of the non-linear capacitance is principally determined by bias voltage-dependent junction capacitance, while when the voltage $V_B$ is higher than or equal to the on-voltage $V_{ON}$, diffusion capacitance proportional to the exponent of the voltage $V_B$ becomes dominant. The actual value of the non-linear capacitance is represented with a curve as indicated by the broken line in FIG. 5. Here, it is assumed that the non-linear capacitance is constant capacitance $C_j$ when the voltage $V_B$ is less than the on-voltage $V_{ON}$ and higher constant capacitance $C_d$ when the voltage $V_B$ is higher than or equal to the on-voltage $V_{ON}$. In the power amplifier 160A, for example, $C_j$=0.6 pF and $C_d$>8 pF.

Figure 6:
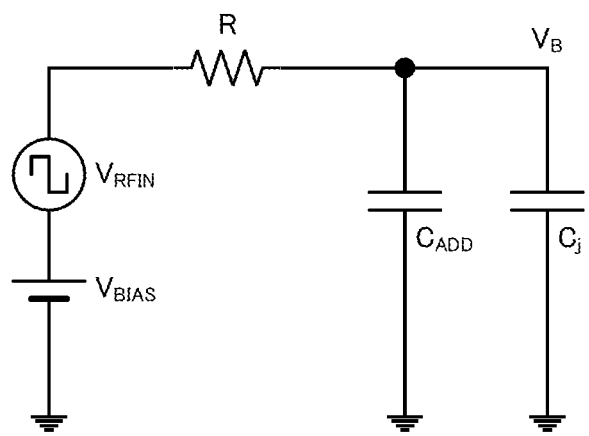
FIG. 6 is a diagram illustrating an equivalent circuit in the case of voltage $V_B$<on-voltage $V_{ON}$.

As illustrated in FIG. 6, when the voltage $V_B$ is less than the on-voltage $V_{ON}$, the diode D is represented as the capacitance $C_j$. In this case, the time constant of the circuit is a value obtained by multiplying a product of $C_j$ and R by $2\pi$, which is about 60 psec.

Figure 7:
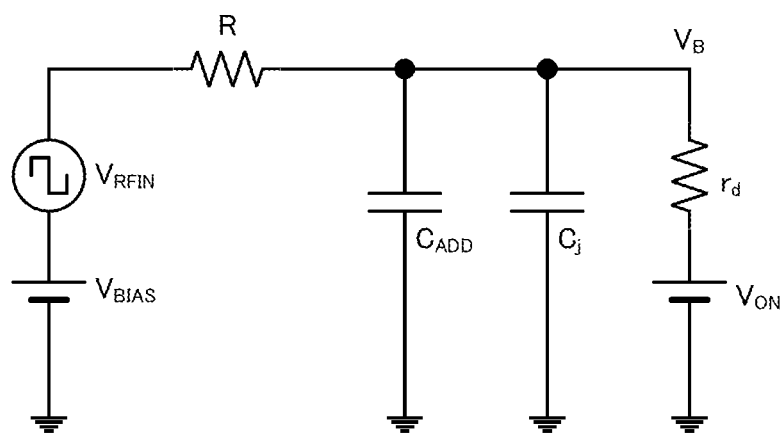
FIG. 7 is a diagram illustrating an equivalent circuit in the case of voltage $V_B \geq$on-voltage $V_{ON}$.

As illustrated in FIG. 7, when the voltage $V_B$ is higher than or equal to the on-voltage $V_{ON}$, the diode D is represented as a parallel connection of the capacitance $C_d$ and the resistance $r_d$. In this case, the time constant of the circuit is a value obtained by multiplying a product of $C_d$ and $r_d$//R by $2\pi$, which is about 220 psec (in the case of $C_d$=8 pF).

Figure 8:
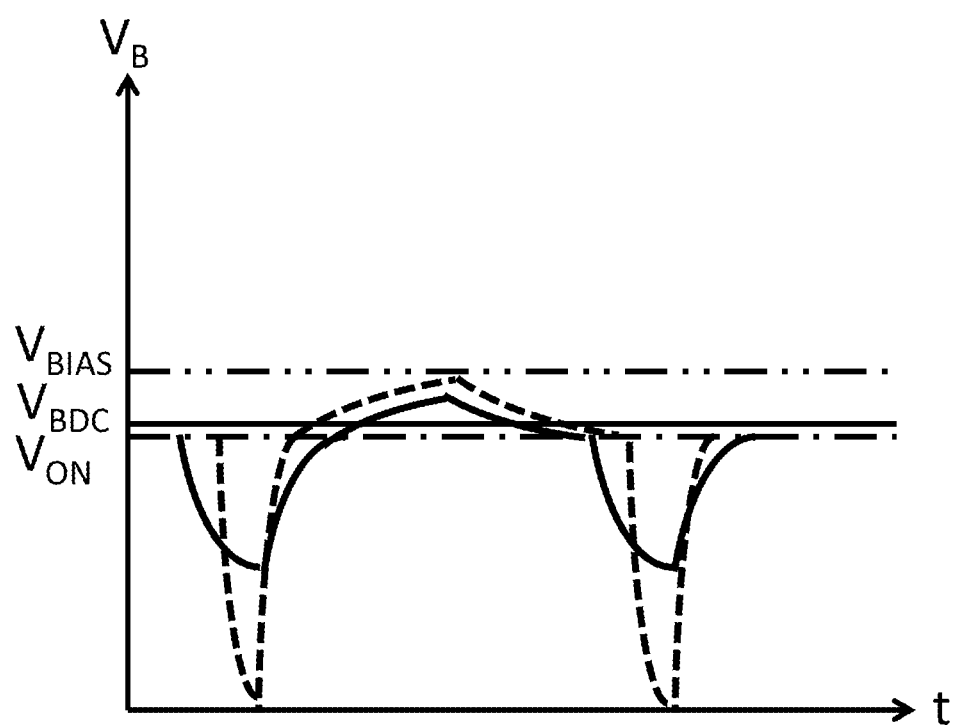
FIG. 8 is a graph illustrating examples of waveforms of the voltage $V_B$.

Since the diode is turned on when DC bias is applied, it operates in an area indicated by an equivalent circuit in FIG. 7. When the RF signal is applied to this circuit, the circuit operates in the area illustrated in FIG. 7 in a range where the amplitude of the RF signal is small. When the amplitude of the RF signal becomes large to some extent, the circuit operates across two areas. In other words, the time constant becomes small in the area where the voltage $V_B$ is less than the on-voltage $V_{ON}$, and the voltage $V_B$ becomes a steep pulsed waveform as indicated by the broken line in FIG. 8.

Next, operation when the capacitor 240 is provided in the power amplifier 160A will be described. This corresponds to a structure with capacitance $C_{ADD}$ added in FIG. 6 and FIG. 7. It is assumed that the capacitance value of the capacitance $C_{ADD}$ is 1 pF. In this case, the time constant in the area where the voltage $V_B$ is less than the on-voltage $V_{ON}$ is 96 psec. The time constant in the area where the voltage $V_B$ is higher than or equal to the on-voltage $V_{ON}$ is 247 psec. The increase rate of the time constant is pronounced in the area where the voltage $V_B$ is less than the on-voltage $V_{ON}$. Therefore, the waveform of the voltage $V_B$ when the RF signal is applied becomes as indicated by the solid line in FIG. 8, where the pulsed waveform is rounded with a prolonged period during which the voltage $V_B$ is less than the on-voltage $V_{ON}$. This means that the off-state period increases. This leads to a decrease in average current value and hence an improvement in efficiency.

Figure 9:
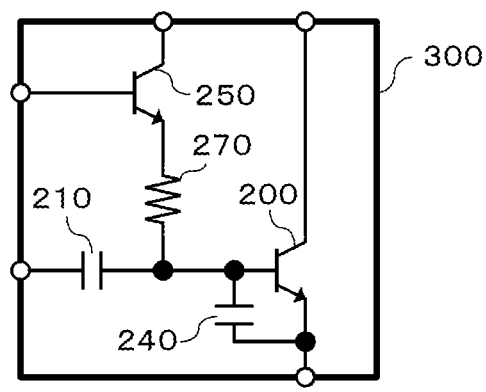
FIG. 9 is a diagram illustrating an example of the structure of a unit cell that can be employed in the power amplifier 160.
Figure 10:
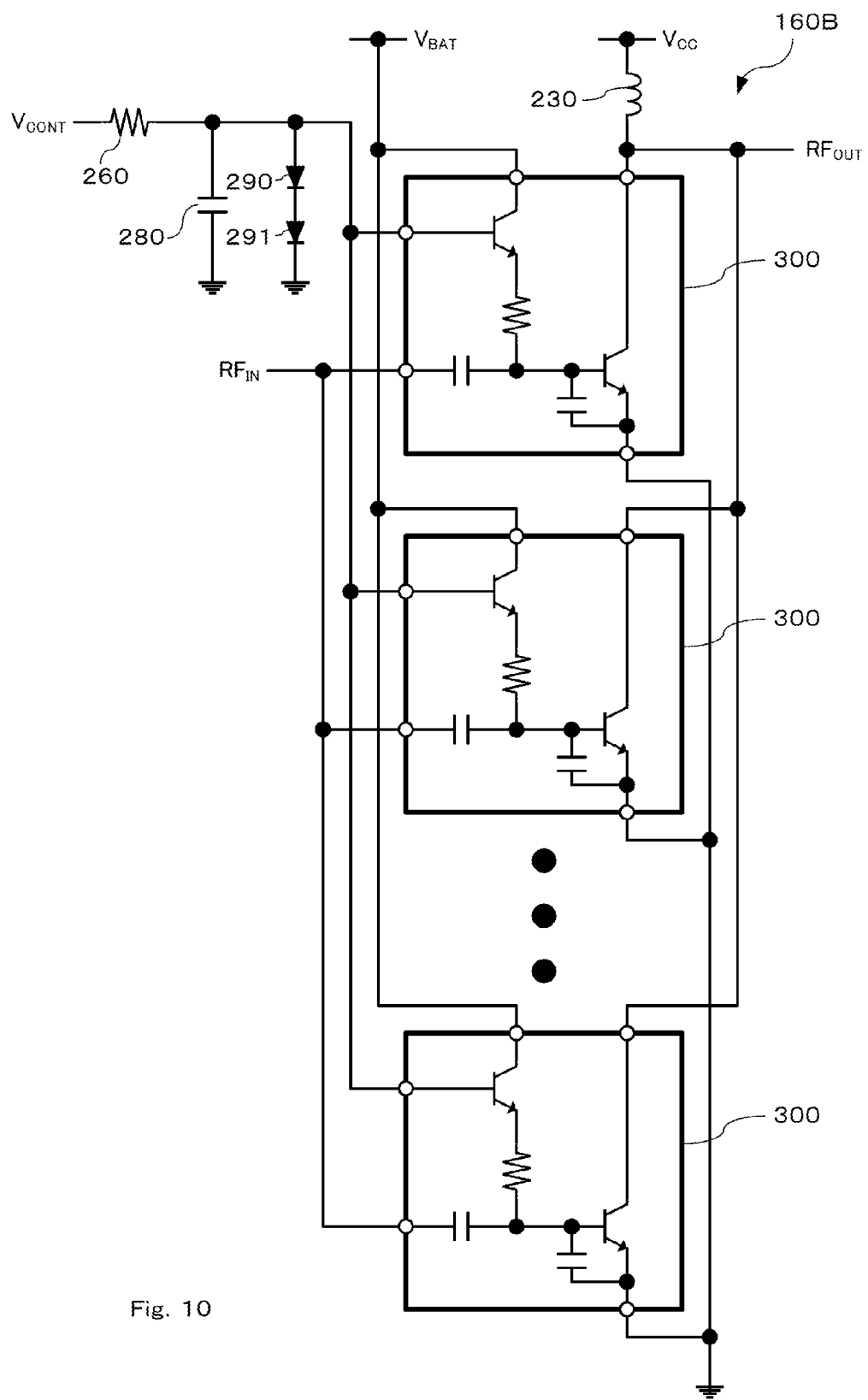
FIG. 10 is a diagram illustrating the configuration of a power amplifier 160B with multiple unit cells 300 connected in parallel.

Although the power amplifier 160A is illustrated in FIG. 2 as an example of the power amplifier 160, the power amplifier 160 can also be made up of multiple unit cells connected in parallel. FIG. 9 is a diagram illustrating an example of the structure of a unit cell that can be used in the power amplifier 160. A unit cell 300 includes the transistor 200, the capacitors 210, 240, the transistor 250, and the resistor 270 in the power amplifier 160A illustrated in FIG. 2. FIG. 10 is a diagram illustrating a configuration of a power amplifier 160B in which multiple (e.g., 16) unit cells 300 are connected in parallel. Even in the power amplifier 160B where the multiple unit cells 300 are connected in parallel, since the capacitor 240 is provided in each unit cell 300, power added efficiency can be improved as mentioned above. Note that the structure of the unit cell 300 illustrated in FIG. 9 is just an example, and elements included in the unit cell are not limited to these elements.

Figure 11:
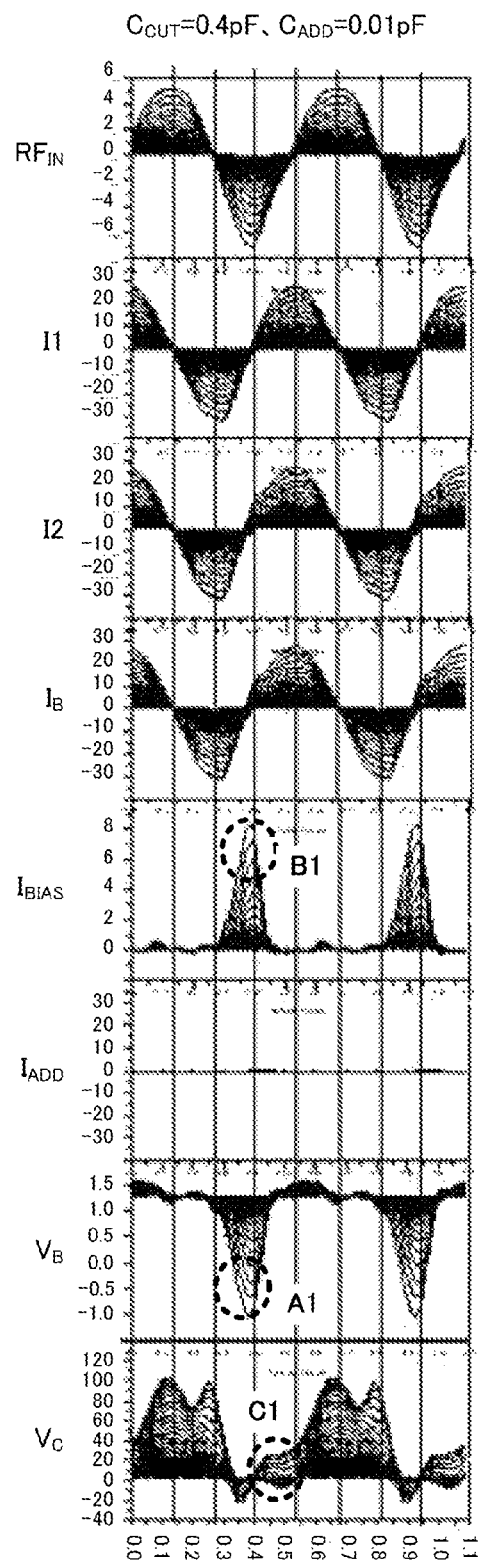
FIG. 11 is a graph illustrating simulation results when the capacitance value $C_{CUT}$ of a capacitor 210 is 0.4 pF and the capacitance value $C_{ADD}$ of a capacitor 240 is 0.01 pF.

Based on simulation results, the following describes that power added efficiency is improved by the power amplifier 160B. FIG. 11 is a graph illustrating simulation results when the capacitance value $C_{CUT}$ of the capacitor 210 is 0.4 pF and the capacitance value $C_{ADD}$ of the capacitor 240 is 0.01 pF. Note that $C_{ADD}$=0.01 pF is a value small enough to ignore the capacitor 240. In other words, the simulation results in FIG. 11 are equivalent to the simulation results when the capacitor 240 is not provided.

In FIG. 11, the abscissa indicates time, and eight indexes are indicated on the ordinate, where $RF_{IN}$ denotes the voltage of the RF signal input to the capacitor 210, I1 denotes current output from the capacitor 210, I2 denotes current obtained by adding $I_{BIAS}$ to I1, $I_B$ denotes base current of the transistor 200, $I_{BIAS}$ denotes bias current output from the bias circuit 220, $I_{ADD}$ denotes current flowing through the capacitor 240, $V_B$ denotes the base voltage of the transistor 200, and $V_C$ denotes the collector voltage of the transistor 200.

As indicated at point A1 in FIG. 11, when the transistor 200 is turned off at high output power (i.e., when the amplitude level of $V_C$ is high), the base voltage $V_B$ significantly drops. Along with this, the bias current $I_{BIAS}$ increases as indicated at point B1. The higher the bias current $I_{BIAS}$, the earlier the timing at which the transistor 200 is turned on as indicated at point C1. From this, it is found that power added efficiency is reduced at high output power in the case where the capacitor 240 is not provided.

Figure 12:
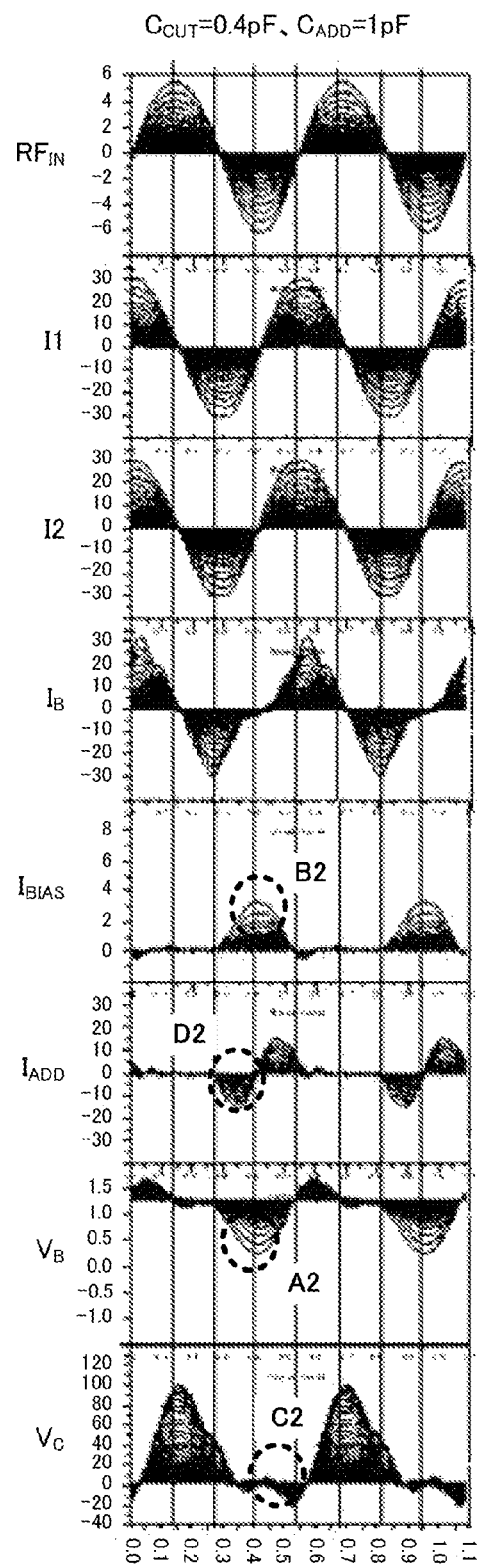
FIG. 12 is a graph illustrating simulation results when the capacitance value $C_{CUT}$ of the capacitor 210 is 0.4 pF and the capacitance value $C_{ADD}$ of the capacitor 240 is 1 pF.

FIG. 12 is a graph illustrating simulation results when the capacitance value $C_{CUT}$ of the capacitor 210 is 0.4 pF and the capacitance value $C_{ADD}$ of the capacitor 240 is 1 pF. The abscissa and the ordinate in FIG. 12 are the same as in FIG. 11.

As indicated at point D2 in FIG. 12, when the transistor 200 is turned off, current (negative current $I_{ADD}$) flows from the capacitor 240 into the base of the transistor 200. As indicated at point A2, this current makes the amount of decrease in base voltage $V_B$ at high output power smaller than that in FIG. 11. Along with this, as indicated at point B2, the amount of increase in bias current $I_{BIAS}$ is also made smaller than that in FIG. 11. This suppresses the timing of turning on the transistor 200 from becoming earlier than that in FIG. 11 as indicated at point C2. Thus, when the capacitor 240 is provided, it is found that the power added efficiency is improved at high output power.

Figure 13:
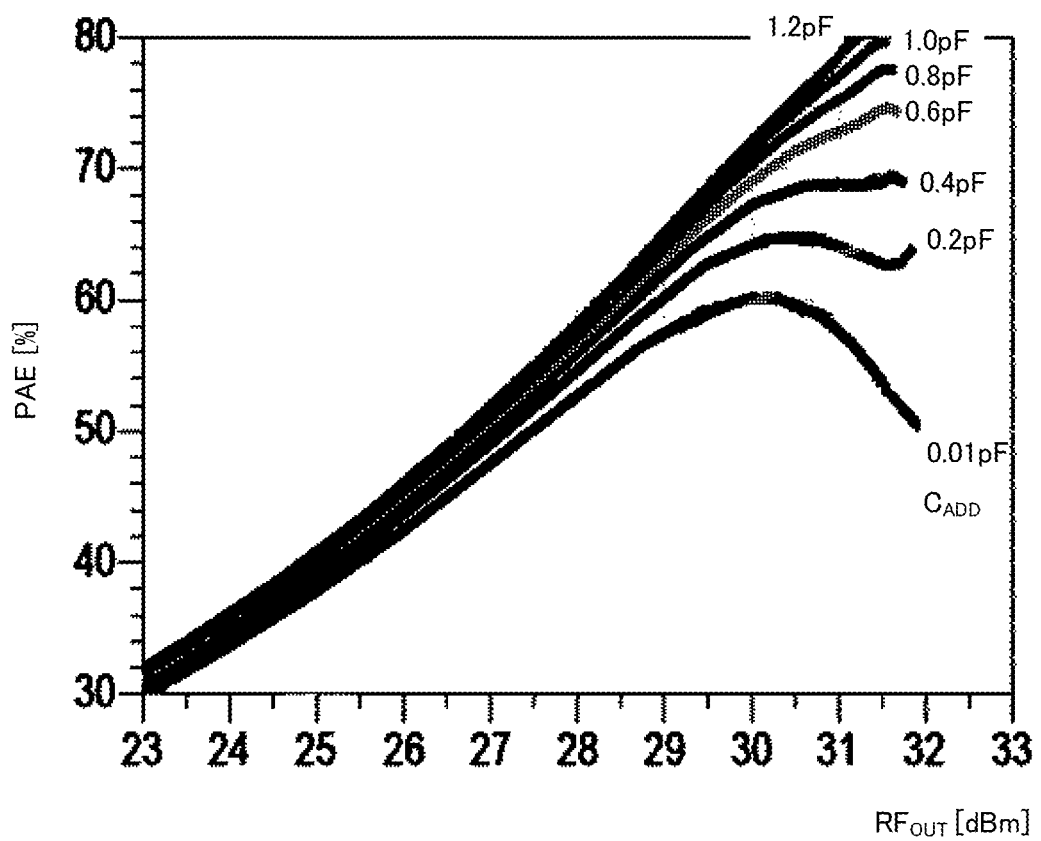
FIG. 13 is a graph illustrating simulation results that indicate a relationship between the capacitance value $C_{ADD}$ of the capacitor 240 and power added efficiency in the power amplifier 160B.

FIG. 13 is a graph illustrating simulation results that indicate an example of the relationship between the capacitance value $C_{ADD}$ of the capacitor 240 and power added efficiency in the power amplifier 160B. In FIG. 13, the abscissa indicates output level (dBm) and the ordinate indicates power added efficiency (%). As illustrated in FIG. 13, when the capacitor 240 is not provided (in the case of $C_{ADD}$=0.01 pF), the power added efficiency starts to decrease largely from an output level of 30 dBm. On the other hand, the addition of the capacitor 240 can suppress the decrease in power added efficiency at high output power. Particularly, in the example illustrated in FIG. 13, when the capacitance value $C_{ADD}$ is set to 0.8 pF to 1.2 pF (roughly equivalent or substantially similar to the capacitance value of the transistor 200 in the off state), power added efficiency at high output power is significantly improved.

Figure 14:
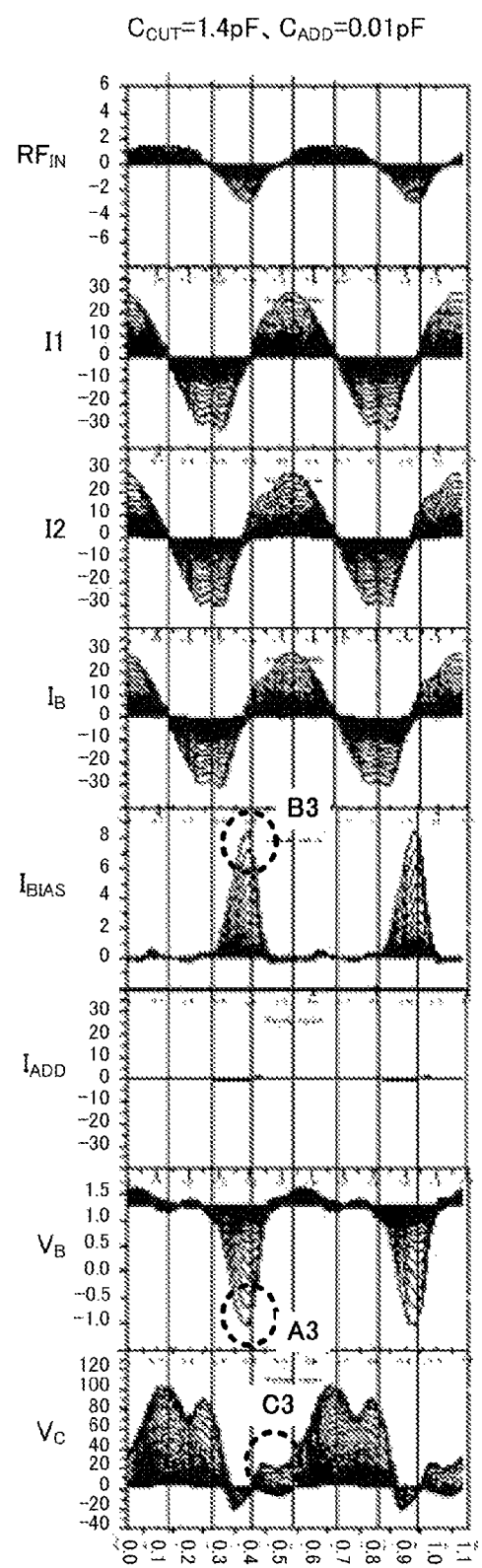
FIG. 14 is a graph illustrating simulation results when the capacitance value $C_{CUT}$ of the capacitor 210 is 1.4 pF and the capacitance value $C_{ADD}$ of the capacitor 240 is 0.01 pF.

Next, simulation results when the capacitance value $C_{CUT}$ of the capacitor 210 is increased to support a broadband RF signal will be described. FIG. 14 is a graph illustrating simulation results when the capacitance value $C_{CUT}$ of the capacitor 210 is 1.4 pF and the capacitance value $C_{ADD}$ of the capacitor 240 is 0.01 pF. The abscissa and the ordinate in FIG. 14 are the same as in FIG. 11.

As indicated at point A3 in FIG. 14, when the transistor 200 is turned off at high output power, the base voltage $V_B$ significantly drops. Along with this, the bias current $I_{BIAS}$ increases as indicated at point B3. The higher the bias current $I_{BIAS}$, the earlier the timing at which the transistor 200 is turned on as indicated at point C3. From this, it is found that power added efficiency is reduced at high output power in the case where the capacitor 240 is not provided.

Figure 15:
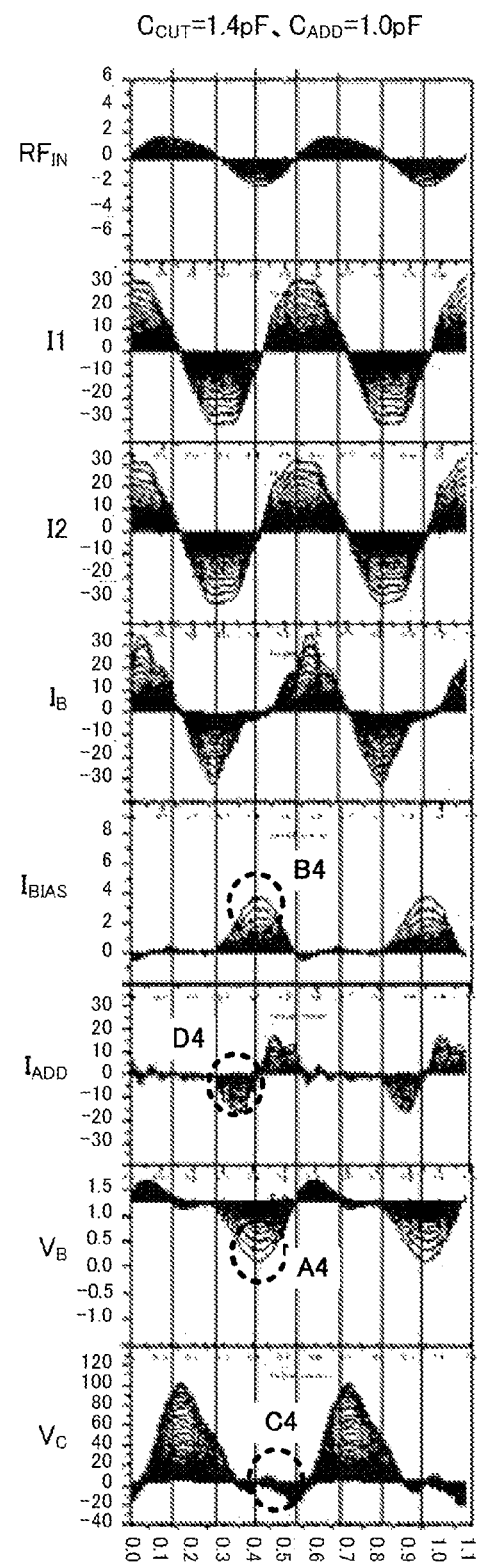
FIG. 15 is a graph illustrating simulation results when the capacitance value $C_{CUT}$ of the capacitor 210 is 1.4 pF and the capacitance value $C_{ADD}$ of the capacitor 240 is 1 pF.

FIG. 15 is a graph illustrating simulation results when the capacitance value $C_{CUT}$ of the capacitor 210 is 1.4 pF and the capacitance value $C_{ADD}$ of the capacitor 240 is 1 pF. The abscissa and the ordinate in FIG. 15 are the same as in FIG. 11.

As indicated at point D4 in FIG. 15, when the transistor 200 is turned off, current (negative current $I_{ADD}$) flows from the capacitor 240 into the base of the transistor 200. As indicated at point A4, this current makes the amount of decrease in base voltage $V_B$ at high output power smaller than that in FIG. 14. Along with this, as indicated at point B4, the amount of increase in bias current $I_{BIAS}$ is also made smaller than that in FIG. 14. This suppresses the timing of turning on the transistor 200 from becoming earlier than that in FIG. 14 as indicated at point C4. When the capacitor 240 is provided, it is found that the power added efficiency is improved at high output power. Thus, when the capacitor 240 is provided regardless of the capacitance value of the capacitor 210, it is found that power added efficiency is improved.

Figure 16:
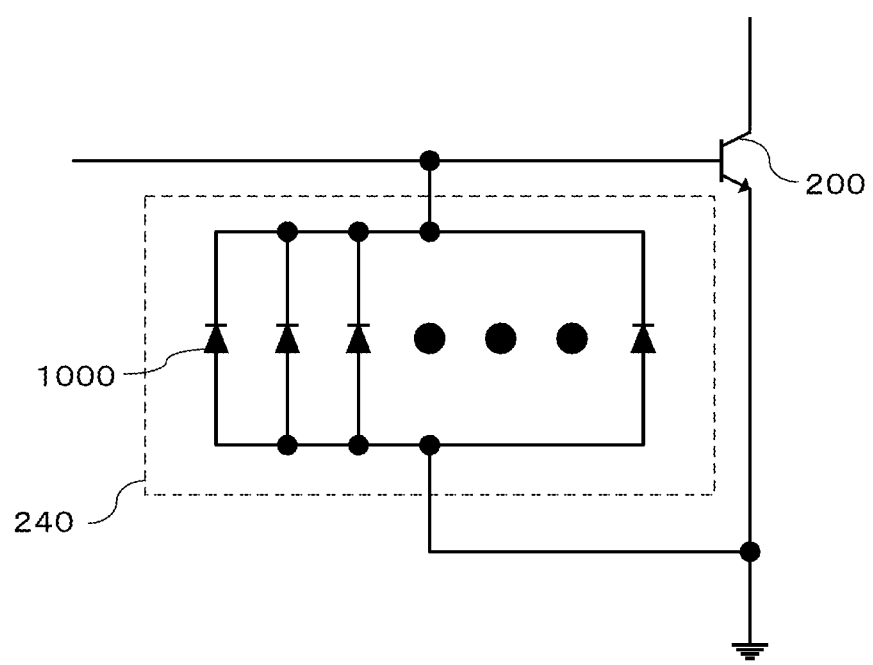
FIG. 16 is a diagram illustrating an example in which the capacitor 240 is made up of diodes.

FIG. 16 is a diagram illustrating an example of a structure in which the capacitor 240 is made up using diodes. As illustrated in FIG. 16, the capacitor 240 can be made up of multiple diodes 1000 connected in parallel. Specifically, as illustrated in FIG. 16, the capacitor 240 can be made up by connecting the cathodes of the diodes 1000 connected in parallel to the base of the transistor 200 and connecting the anodes of the diodes 1000 to the emitter of the transistor 200. Compared with the structure of the capacitor 240 set as MIM capacitance, the capacitor 240 made up of multiple diodes 1000 connected in parallel can decrease a chip size when the power amplifier 160 is integrated.

The embodiments of the present disclosure have been described above. As described above, according to the embodiments, the capacitor 240 with one end connected to the base of the transistor 200 and the other end connected to the emitter of the transistor 200 is provided to enable an improvement in the power added efficiency of the power amplifier 160 at high output power.

Further, according to the embodiments, the capacitance value $C_{ADD}$ of the capacitor 240 is set to be roughly equivalent or substantially similar to the capacitance value of the transistor 200 in the off state, and this can significantly improve power added efficiency at high output power.

Note that each of the embodiments described above is to make it easy to understand the present disclosure, and should not be interpreted to limit the present disclosure. The present disclosure can be modified and improved without departing from the spirit of the disclosure, and equivalents thereof are included in the present disclosure. In other words, each of the embodiments subjected appropriately to design change by those skilled in the art is included in the scope of the present disclosure as long as it has substantially the same features of the present disclosure. For example, each component included in each embodiment, and the arrangement, material, condition, shape, size, and the like thereof are not limited to illustrated ones, and can be appropriately changed. Further, respective components included in respective embodiments can be combined if technically possible, and the combined components are included in the scope of the present disclosure as long as they have substantially the same features of the present disclosure.

For example, the bias circuit 220 is formed as an emitter-follower circuit by the transistor 250 in the embodiments, but the structure of the bias circuit 220 is not limited thereto. Specifically, any structure can be employed for the bias circuit 220 as long as the bias current $I_{BIAS}$ increases with a decrease in the base voltage $V_B$ of the transistor 200.

Further, the example of providing the capacitor 240 in the power amplifier 160 as the power stage of the power amplification module 120 is described in the embodiments, but a configuration equivalent to that of the power amplifier 160 can also be employed in the power amplifier 150 as the drive stage. The same holds for a configuration having three-stage power amplifiers or more.

DESCRIPTION OF REFERENCE NUMERALS 100 transmitting unit
110 modulation unit
120 power amplification module
130 front end unit
140 antenna
150, 160 power amplifier
170, 180, 190 matching circuit
200, 250 transistor
210, 240, 280 capacitor
220 bias circuit
230 Inductor
260, 270 resistor
290, 291, 1000 diode
300 unit cell

What is claimed is:

1. A power amplifier comprising:
   a first capacitor with a radio frequency signal input to a first end of the first capacitor;
   a first transistor whose base is connected to a second end of the first capacitor to amplify the radio frequency signal;
   a bias circuit for supplying bias to the base of the first transistor; and
   a second capacitor with a first end connected to the base of the first transistor and a second end connected to an emitter of the first transistor,
   wherein the first end of the second capacitor is connected directly to the base of the first transistor.

2. The power amplifier according to claim 1, wherein the second capacitor is made up of at least one diode, and a cathode of the diode is connected to the base of the first transistor and an anode of the diode is connected to the emitter of the first transistor.

3. The power amplifier according to claim 1, wherein the first end of the second capacitor is connected directly to the second end of the first capacitor.

4. The power amplifier according to claim 1, wherein the bias circuit includes:
   a second transistor with a power-supply voltage applied to a collector of the second transistor and a bias control voltage applied to a base of the second transistor; and
   a first resistor with a first end connected to an emitter of the second transistor and a second end connected to the base of the first transistor.

5. The power amplifier according to claim 4, wherein the first end of the second capacitor is connected directly to the second end of the first resistor.

6. The power amplifier according to claim 1, wherein a capacitance value of the second capacitor is substantially similar to a capacitance value of the first transistor in an off state.

7. A power amplifier comprising:
   a first capacitor with a radio frequency signal input to a first end of the first capacitor;
   a first transistor whose base is connected to a second end of the first capacitor to amplify the radio frequency signal;
   a bias circuit for supplying bias to the base of the first transistor; and
   a second capacitor with a first end connected to the base of the first transistor and a second end connected to an emitter of the first transistor,
   wherein the first end of the second capacitor is connected directly to the second end of the first capacitor.

8. The power amplifier according to claim 7, wherein the bias circuit includes:
   a second transistor with a power-supply voltage applied to a collector of the second transistor and a bias control voltage applied to a base of the second transistor; and
   a first resistor with a first end connected to an emitter of the second transistor and a second end connected to the base of the first transistor.

9. The power amplifier according to claim 7, wherein a capacitance value of the second capacitor is substantially similar to a capacitance value of the first transistor in an off state.

10. The power amplifier according to claim 7, wherein the second capacitor is made up of at least one diode, and a cathode of the diode is connected to the base of the first transistor and an anode of the diode is connected to the emitter of the first transistor.

11. The power amplifier according to claim 8, wherein the first end of the second capacitor is connected directly to the second end of the first resistor.

12. A power amplifier comprising:
a first capacitor with a radio frequency signal input to a first end of the first capacitor;
a first transistor whose base is connected to a second end of the first capacitor to amplify the radio frequency signal;
a bias circuit for supplying bias to the base of the first transistor; and
a second capacitor with a first end connected to the base of the first transistor and a second end connected to an emitter of the first transistor,
wherein the bias circuit includes:
a second transistor with a power-supply voltage applied to a collector of the second transistor and a bias control voltage applied to a base of the second transistor; and
a first resistor with a first end connected to an emitter of the second transistor and a second end connected to the base of the first transistor.

13. The power amplifier according to claim 12, wherein a capacitance value of the second capacitor is substantially similar to a capacitance value of the first transistor in an off state.

14. The power amplifier according to claim 12, wherein the second capacitor is made up of at least one diode, and a cathode of the diode is connected to the base of the first transistor and an anode of the diode is connected to the emitter of the first transistor.

15. The power amplifier according to claim 14, wherein the first end of the second capacitor is connected directly to the second end of the first resistor.

* * * * *